(12) United States Patent
Li

(10) Patent No.: US 11,384,253 B2
(45) Date of Patent: Jul. 12, 2022

(54) DUAL ADDITIVE COMPOSITION FOR POLISHING MEMORY HARD DISKS EXHIBITING EDGE ROLL OFF

(71) Applicant: Cabot Microelectronics Corporation, Aurora, IL (US)

(72) Inventor: Tong Li, Singapore (SG)

(73) Assignee: CMC Materials, Inc., Aurora, IL (US)

(*) Notice: Subject to any disclaimer, the term of this patent is extended or adjusted under 35 U.S.C. 154(b) by 0 days.

(21) Appl. No.: 16/729,905

(22) Filed: Dec. 30, 2019

(65) Prior Publication Data

US 2020/0224057 A1     Jul. 16, 2020

Related U.S. Application Data

(60) Provisional application No. 62/791,184, filed on Jan. 11, 2019.

(51) Int. Cl.
| | |
|---|---|
| *C09G 1/02* | (2006.01) |
| *H01L 21/321* | (2006.01) |
| *C09K 13/00* | (2006.01) |
| *H01L 21/306* | (2006.01) |
| *C23F 1/30* | (2006.01) |

(Continued)

(52) U.S. Cl.
CPC .............. *C09G 1/02* (2013.01); *C09K 13/00* (2013.01); *H01L 21/30625* (2013.01); *H01L 21/3212* (2013.01); *C23F 1/30* (2013.01); *C23F 3/06* (2013.01); *G11B 5/84* (2013.01)

(58) Field of Classification Search
CPC . C09G 1/02; H01L 21/30625; H01L 21/3212; C09K 13/00; C23F 1/30; C23F 3/06; G11B 5/84
See application file for complete search history.

(56) References Cited

U.S. PATENT DOCUMENTS

| | | | |
|---|---|---|---|
| 6,527,622 B1 * | 3/2003 | Brusic | B24B 37/044 257/E21.304 |
| 6,945,851 B2 | 9/2005 | Ward et al. | |

(Continued)

FOREIGN PATENT DOCUMENTS

| | | |
|---|---|---|
| CN | 103937414 A | 7/2014 |
| JP | 2005174442 A | 6/2005 |

(Continued)

OTHER PUBLICATIONS

Korean Intellectual Property Office as ISA, International Search Report and Written Opinion of International Searching Authority issued in connection with PCT/US2019/068917 dated Apr. 29, 2020.

(Continued)

*Primary Examiner* — Anita K Alanko

(74) *Attorney, Agent, or Firm* — Thomas Omholt; Erika R. Singleton

(57) ABSTRACT

The invention provides a chemical-mechanical polishing composition comprising (a) an abrasive comprising colloidal silica, (b) a compound of formula (I), (c) a compound of formula (II), (d) hydrogen peroxide, and (e) water, wherein the polishing composition has a pH of about 1 to about 5. The invention also provides a method of chemically-mechanically polishing a substrate, especially a nickel-phosphorous substrate, by contacting the substrate with the inventive chemical-mechanical polishing composition.

18 Claims, 4 Drawing Sheets

Figure 1A:
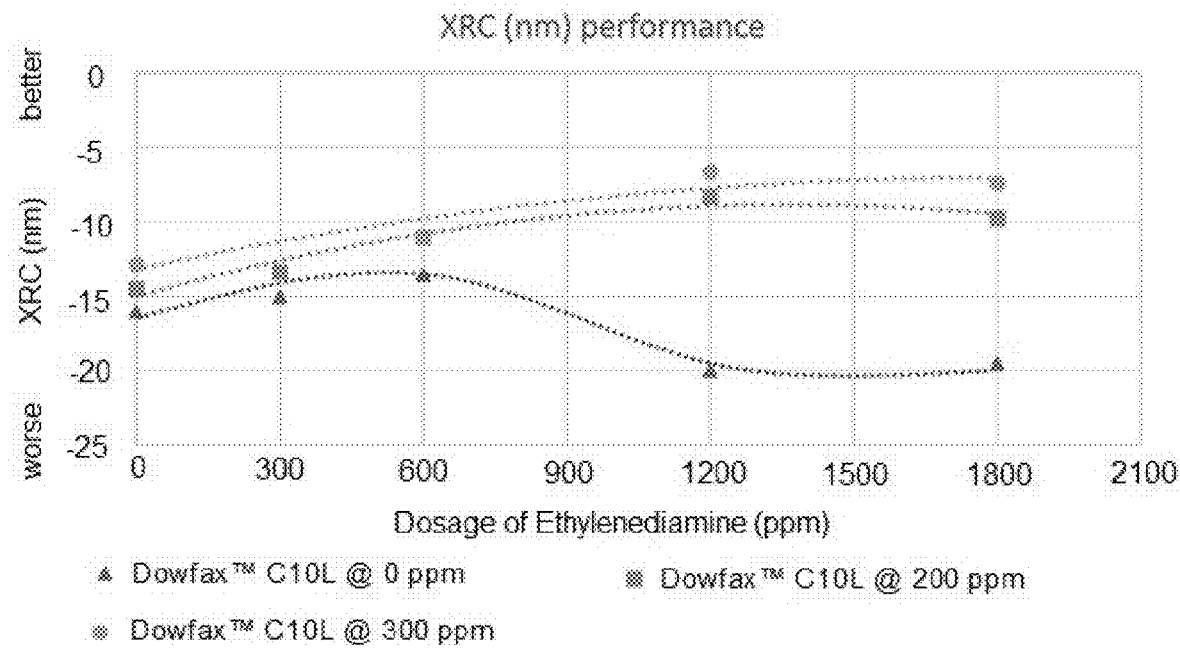

(51) Int. Cl.
G11B 5/84 (2006.01)
C23F 3/06 (2006.01)

(56) References Cited

U.S. PATENT DOCUMENTS

| | | |
|---|---|---|
| 8,956,430 B2 | 2/2015 | Yamaguchi |
| 2009/0246956 A1 | 10/2009 | Takamiya et al. |
| 2011/0155690 A1* | 6/2011 | Yamaguchi .......... C09K 3/1463 |
| | | 216/22 |
| 2015/0315417 A1 | 11/2015 | Lau et al. |
| 2016/0102227 A1* | 4/2016 | Zhang ..................... B24B 37/11 |
| | | 216/38 |
| 2019/0367774 A1 | 12/2019 | Palanisamy Chinnathambi |

FOREIGN PATENT DOCUMENTS

| | | | |
|---|---|---|---|
| JP | 2014205756 A | 10/2014 | |
| WO | WO-2006058504 A1 * | 6/2006 | ......... H01L 21/3212 |
| WO | 2010141652 A2 | 12/2010 | |
| WO | 2015187820 A1 | 12/2015 | |
| WO | 2016061116 A1 | 4/2016 | |

OTHER PUBLICATIONS

Taiwan Intellectual Property Office, Office Action issued in connection with Taiwan Patent Application No. 108148458 dated Aug. 26, 2020.

* cited by examiner

DUAL ADDITIVE COMPOSITION FOR POLISHING MEMORY HARD DISKS EXHIBITING EDGE ROLL OFF

BACKGROUND OF THE INVENTION

The demand for increased storage capacity in memory or rigid disks and the trend towards miniaturization of memory or rigid disks (e.g., due to the requirement for smaller hard drives in computer equipment) continues to emphasize the importance of the memory or rigid disk manufacturing process, including the planarization or polishing of such disks for ensuring maximal performance. While there exist several chemical-mechanical polishing (CMP) compositions and methods for use in conjunction with semiconductor device manufacture, few conventional CMP methods or commercially available CMP compositions are well-suited for the planarization or polishing of memory or rigid disks.

As the demand for greater storage capacity has increased, so has the need for improved processes for the polishing of such memory or rigid disks. The term "memory or rigid disk" refers to any magnetic disk, hard disk, rigid disk, or memory disk for retaining information in electromagnetic form. The memory or rigid disk typically has a surface that comprises nickel-phosphorus, but the memory or rigid disk surface can comprise any other suitable material. The planarity of the memory or rigid disks must be improved, as the distance between the recording head of a disk drive and the surface of the memory or rigid disk has decreased with improvements in recording density that demand a lower flying height of the magnetic head with respect to the memory or rigid disk. In order to permit a lower flying height of the magnetic head, improvements to the surface finish of the memory or rigid disk are required.

During the polishing of a memory or rigid disk, typically the edges of the disk receive a higher pressure from the polishing tool than the remaining surface area of the disk. Typically, polishing is performed using a combination of an abrasive, a polishing pad, and a liquid carrier, in which the abrasive may be suspended in the liquid carrier, or may be affixed to the surface of the pad. As the polishing process mainly consists of mechanical abrasion of the disk by the abrasive and/or pad, in conjunction with the action of chemicals that may be present, and the rate of abrasion is at least in part a function of pressure applied, the edges of the disk experience a higher rate of abrasion than the rest of the disk. This leads to the formation of a curved, or rounded, contour at the edges of the disk, known in the art as edge roll-off, rub-off, or dub-off. Such rounded areas on a disk are unsuitable for recording. Thus, if the amount of roll-off can be reduced, the recording capacity for a disk can be increased.

Thus, there remains in the art a need for chemical-mechanical polishing compositions for memory or rigid disks that exhibit satisfactory nickel-phosphorous removal rates while minimizing the amount of roll-off resulting from polishing.

BRIEF SUMMARY OF THE INVENTION

The invention provides a chemical-mechanical polishing composition comprising (a) an abrasive comprising colloidal silica, (b) about 10 ppm to about 1000 ppm of a compound of formula (I):

$$R-X-\overset{O}{\underset{O}{\overset{\|}{S}}}-O-H \quad (I)$$

wherein R is selected from:
a straight chain or branched chain $C_1$-$C_{20}$ alkyl,

[chemical structures shown: a substituted succinate with $R^1O$, $OR^2$ groups; and a diphenyl ether with $R^3$, $R^4$ substituents and $HO_2SY$, $(YSO_2H)_p$ groups]

$R^5C_6H_4$,
$R^6-O-(R^7O)_n-$, and
$CH_2=CHCONHC(CH_3)_2CH_2-$, wherein $R^1$-$R^5$ are independently selected from straight chain or branched chain $C_1$-$C_{20}$ alkyls,
wherein $R^6$ is a straight chain or branched chain $C_1$-$C_{20}$ alkyl or $R^8-C_6H_4-$,
wherein $R^7$ is a straight chain or branched chain $C_2$-$C_{10}$ alkylene,
wherein $R^8$ is a straight chain or branched chain $C_1$-$C_{20}$ alkyl,
wherein n is an integer of from 1 to about 20,
wherein p is 0 or 1, and
wherein X and Y are independently O or a covalent bond, or an alkali metal salt thereof,
(c) a compound of formula (II):

$$R^9-\overset{H}{N}-(CH_2)_m-NH_2 \quad (II)$$

wherein $R^9$ is H or a hydroxyalkyl, and
wherein m is an integer of from 2 to about 6,
(d) hydrogen peroxide, and (e) water, wherein the polishing composition has a pH of about 1 to about 5.

The invention provides a chemical-mechanical polishing composition comprising
(a) an abrasive comprising colloidal silica, (b) about 10 ppm to about 1000 ppm of a compound of formula (I):

$$R-X-\overset{O}{\underset{O}{\overset{\|}{S}}}-O-H \quad (I)$$

wherein R is selected from:
a straight chain or branched chain $C_1$-$C_{20}$ alkyl,

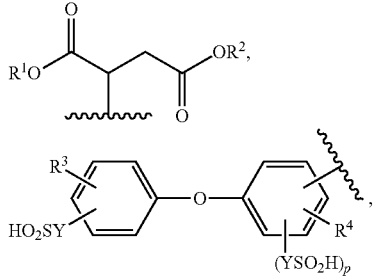

$R^5C_6H_4$,
$R^6$—O—$(R^7O)_n$—, and
$CH_2$=$CHCONHC(CH_3)_2CH_2$—,
wherein $R^1$-$R^5$ are independently selected from straight chain or branched chain $C_1$-$C_{20}$ alkyls,
wherein $R^6$ is a straight chain or branched chain $C_1$-$C_{20}$ alkyl or $R^8$—$C_6H_4$—,
wherein $R^7$ is a straight chain or branched chain $C_2$-$C_{10}$ alkylene,
wherein $R^8$ is a straight chain or branched chain $C_1$-$C_{20}$ alkyl,
wherein n is an integer of from 1 to about 20,
wherein p is 0 or 1, and
wherein X and Y are independently O or a covalent bond, or an alkali metal salt thereof, (c) a urea compound or a piperazine compound:

(d) hydrogen peroxide, and (e) water, wherein the polishing composition has a pH of about 1 to about 5.

The invention also provides a method of chemically mechanically polishing a substrate comprising (i) providing a substrate, (ii) providing a polishing pad, (iii) providing a chemical-mechanical polishing composition comprising (a) an abrasive comprising colloidal silica, (b) about 0.001 wt. % to about 1 wt. % of a compound of formula (I):

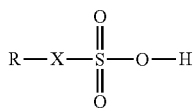

wherein R is selected from:
a straight chain or branched chain $C_1$-$C_{20}$ alkyl.

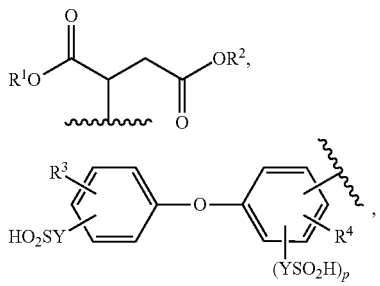

$R^5C_6H_4$,
$R^6$—O—$(R^7O)_n$—, and
$CH_2$=$CHCONHC(CH_3)_2CH_2$—,
wherein $R^1$-$R^5$ are independently selected from straight chain or branched chain $C_1$-$C_{20}$ alkyls,
wherein $R^6$ is a straight chain or branched chain $C_1$-$C_{20}$ alkyl or $R^8$—$C_6H_4$—,
wherein $R^7$ is a straight chain or branched chain $C_2$-$C_{10}$ alkylene,
wherein $R^8$ is a straight chain or branched chain $C_1$-$C_{20}$ alkyl,
wherein n is an integer of from 1 to about 20,
wherein p is 0 or 1, and
wherein X and Y are independently O or a covalent bond, or an alkali metal salt thereof,
(c) a compound of formula (II):

wherein $R^9$ is H or a hydroxyalkyl, and
wherein m is an integer of from 2 to about 6,
(d) hydrogen peroxide, and (e) water, wherein the polishing composition has a pH of about 1 to about 5, (iv) contacting the substrate with the polishing pad and the chemical-mechanical polishing composition, and (v) moving the polishing pad and the chemical mechanical polishing composition relative to the substrate to abrade at least a portion of a surface of the substrate to thereby polish the substrate.

BRIEF DESCRIPTION OF THE SEVERAL VIEWS OF THE DRAWING(S)

FIG. 1A graphically illustrates XRC (extreme radius of curvature) exhibited by polishing compositions described in Example 1 and comprising colloidal silica, a compound of formula (II) (i.e., ethylenediamine) and/or a compound of formula (I) (i.e., a diphenyloxide disulfonate surfactant, Dowfax™ C10L) when used for polishing Ni—P-coated aluminum disks, in accordance with an embodiment of the invention.

Figure 1B:
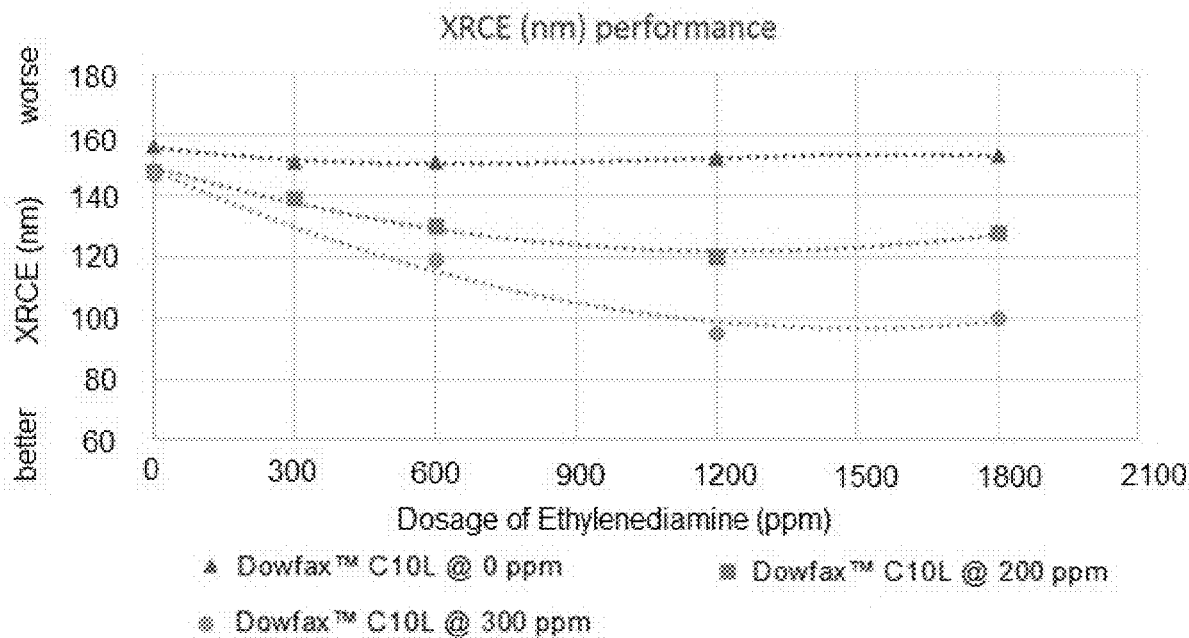

FIG. 1B graphically illustrates XRCE (extreme radius of curvature at the extreme edge of the disk) exhibited by polishing compositions described in Example 1 and comprising colloidal silica, a compound of formula (II) (i.e., ethylenediamine) and/or a compound of formula (I) (i.e., a diphenyloxide disulfonate surfactant, Dowfax™ C10L) when used for polishing Ni—P-coated aluminum disks, in accordance with an embodiment of the invention.

Figure 1C:
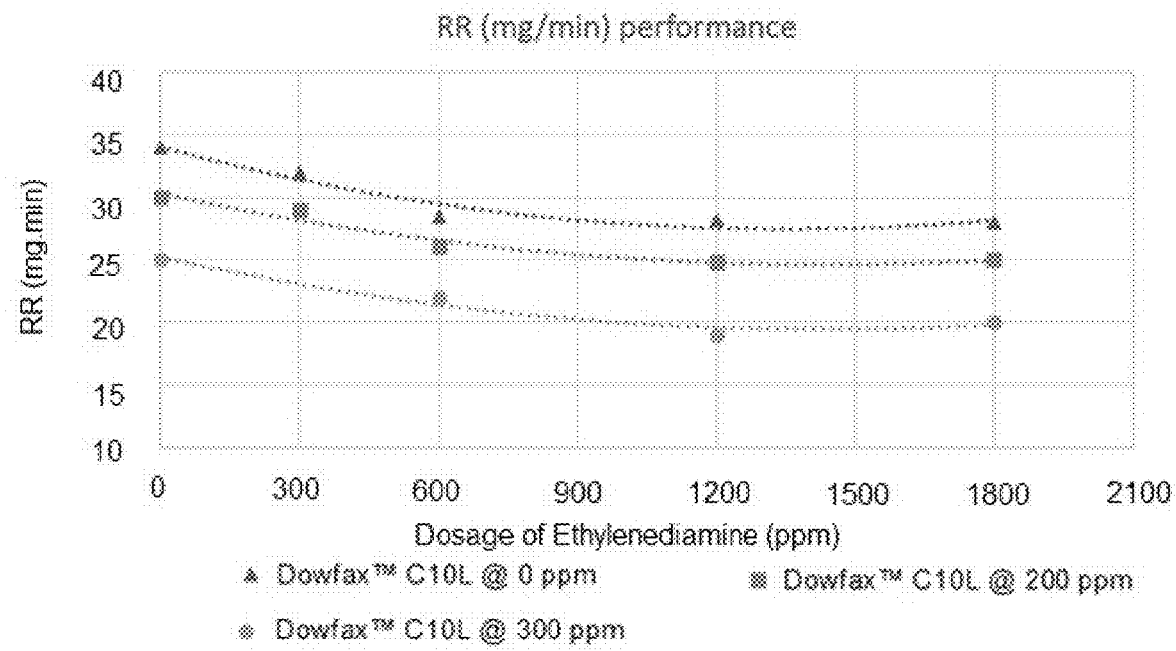

FIG. 1C graphically illustrates microwaviness exhibited by polishing compositions described in Example 1 and comprising colloidal silica, a compound of formula (II) (i.e., ethylenediamine) and/or a compound of formula (I) (i.e., a diphenyloxide disulfonate surfactant, Dowfax™ C10L) when used for polishing Ni—P-coated aluminum disks, in accordance with an embodiment of the invention.

Figure 1D:
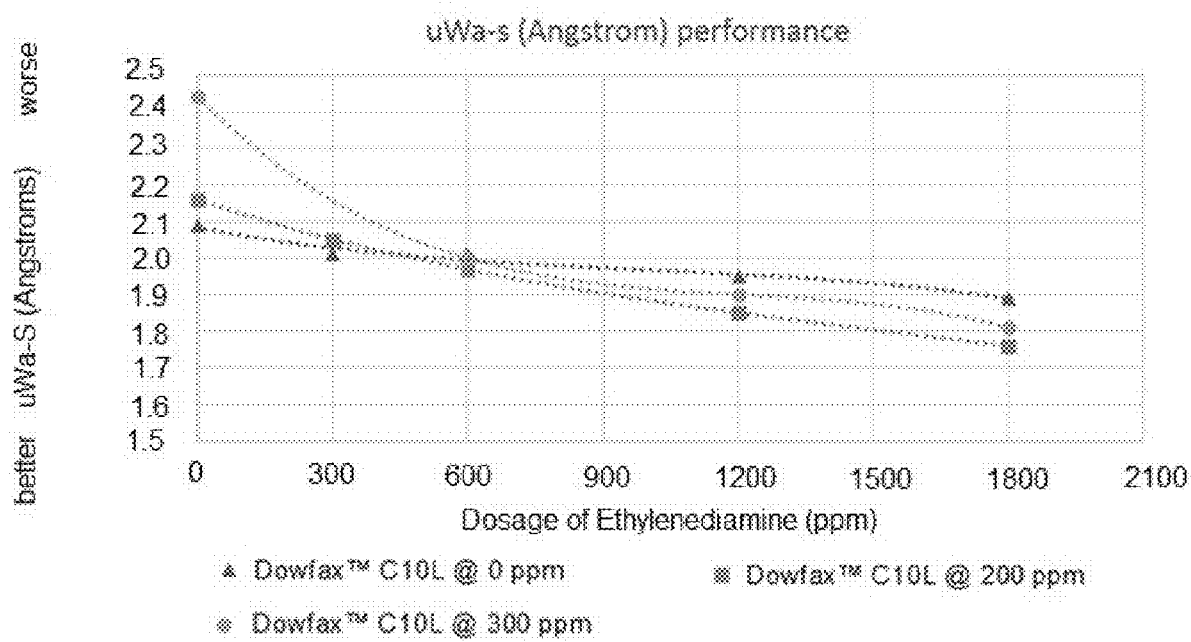

FIG. 1D graphically illustrates the Ni—P removal rates exhibited by polishing compositions described in Example 1 and comprising colloidal silica, a compound of formula (II) (i.e., ethylenediamine) and/or a compound of formula (I) (i.e., a diphenyloxide disulfonate surfactant, Dowfax™ C10L) when used for polishing Ni—P-coated aluminum disks, in accordance with an embodiment of the invention.

Figure 2A:
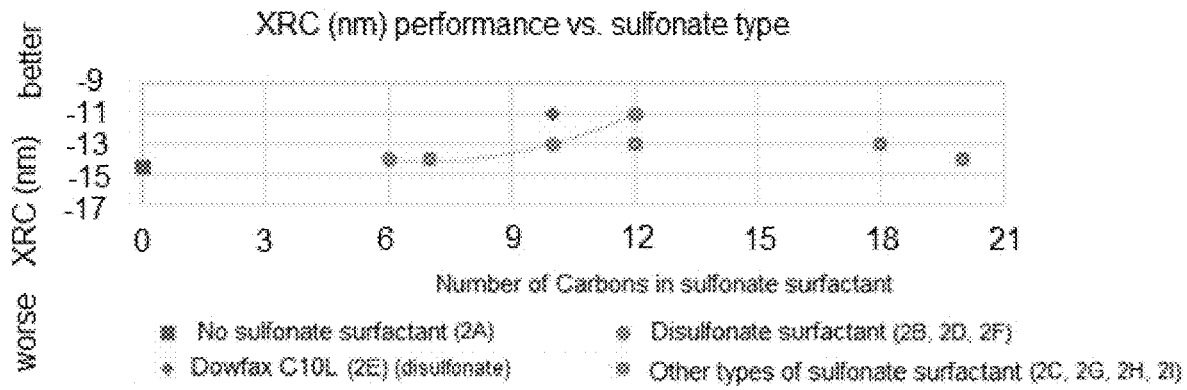

FIG. 2A graphically illustrates XRC (extreme radius of curvature) exhibited by polishing compositions described in Example 2 and comprising colloidal silica, a compound of formula (II) (i.e., ethylenediamine), and various compounds of formula (I) (i.e., sulfonate surfactants) when used for polishing Ni—P-coated aluminum disks, in accordance with an embodiment of the invention.

Figure 2B:
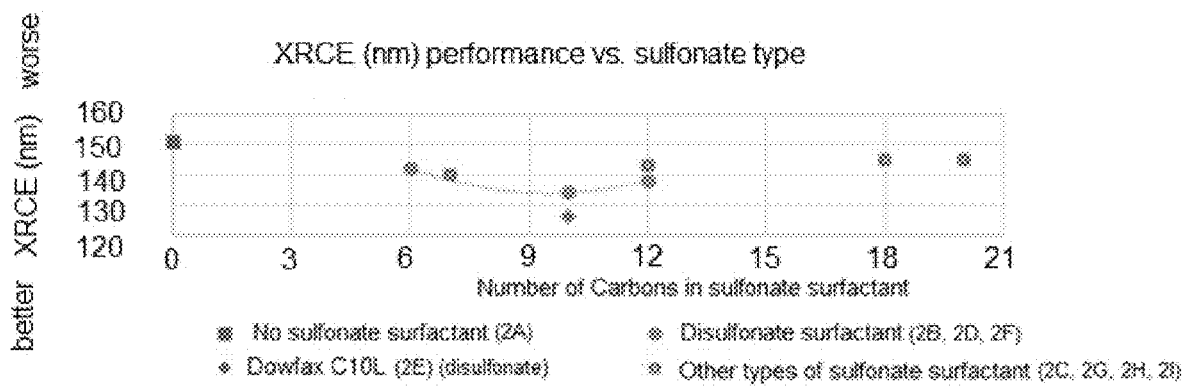

FIG. 2B graphically illustrates XRCE (extreme radius of curvature at the extreme edge of the disk) exhibited by polishing compositions described in Example 2 and comprising colloidal silica, a compound of formula (II) (i.e., ethylenediamine), and various compounds of formula (I) (i.e., sulfonate surfactants) when used for polishing Ni—P-coated aluminum disks, in accordance with an embodiment of the invention.

Figure 2C:
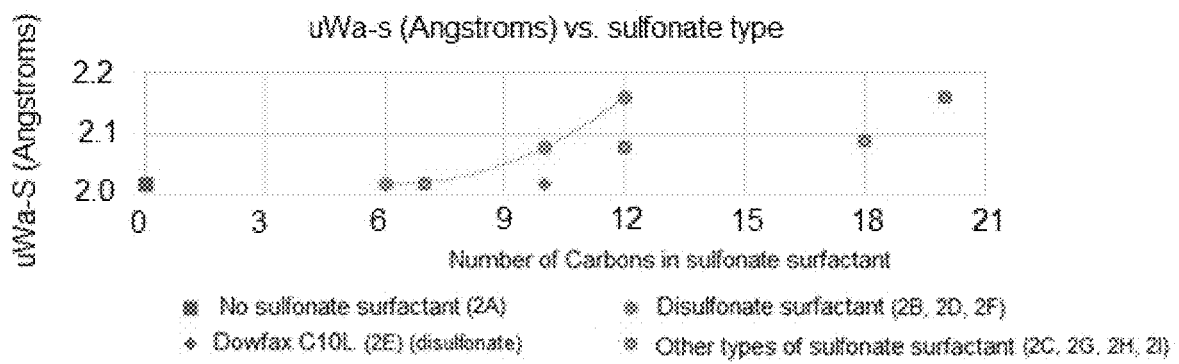

FIG. 2C graphically illustrates microwaviness exhibited by polishing compositions described in Example 2 and comprising colloidal silica, a compound of formula (II) (i.e., ethylenediamine), and various compounds of formula (I) (i.e., sulfonate surfactants) when used for polishing Ni—P-coated aluminum disks, in accordance with an embodiment of the invention.

Figure 2D:
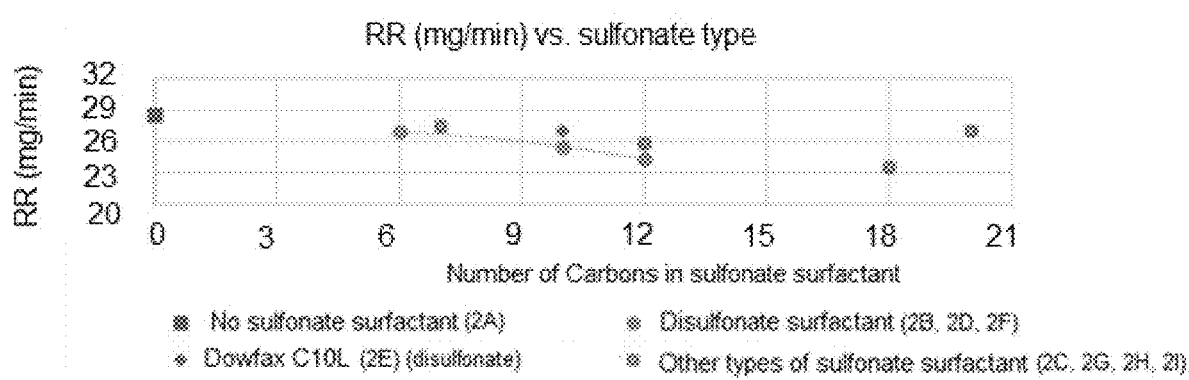

FIG. 2D graphically illustrates the Ni—P removal rates exhibited by polishing compositions described in Example 2 and comprising colloidal silica, a compound of formula (II) (i.e., ethylenediamine), and various compounds of formula (I) (i.e., sulfonate surfactants) when used for polishing Ni—P-coated aluminum disks, in accordance with an embodiment of the invention.

DETAILED DESCRIPTION OF THE INVENTION

The invention provides a chemical-mechanical polishing composition comprising, consisting essentially of, or consisting of: (a) an abrasive comprising colloidal silica, (b) about 0.001 wt. % to about 1 wt. % of a compound of formula (I):

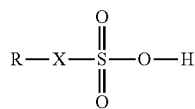

wherein R is selected from:
a straight chain or branched chain $C_1$-$C_{20}$ alkyl,

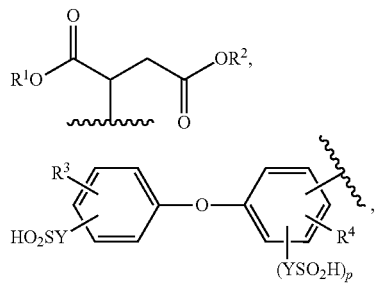

$R^5C_6H_4$,
$R^6$—O—$(R^7O)_n$—, and
$CH_2$=$CHCONHC(CH_3)_2CH_2$—,
wherein $R^1$-$R^5$ are independently selected from straight chain or branched chain $C_1$-$C_{20}$ alkyls,
wherein $R^6$ is a straight chain or branched chain $C_1$-$C_{20}$ alkyl or $R^8$—$C_6H_4$—,
wherein $R^7$ is a straight chain or branched chain $C_2$-$C_{10}$ alkylene, wherein $R^8$ is a straight chain or branched chain $C_1$-$C_{20}$ alkyl,
wherein n is an integer of from 1 to about 20,
wherein p is 0 or 1, and
wherein X and Y are independently O or a covalent bond, or an alkali metal salt thereof,
(c) a compound of formula (II):

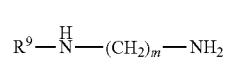

wherein $R^9$ is H or a hydroxyalkyl, and
wherein m is an integer of from 2 to about 6,
(d) hydrogen peroxide, and (e) water, wherein the polishing composition has a pH of about 1 to about 5.

The chemical-mechanical polishing composition includes an abrasive that comprises colloidal silica. The colloidal silica can be any suitable colloidal silica. For example, the colloidal silica can be a wet process silica, such as a condensation-polymerized silica. Condensation-polymerized silica typically is prepared by condensing $Si(OH)_4$ to form colloidal particles, where colloidal is defined as having an average particle size between about 1 nm and about 1000 nm. Such abrasive particles can be prepared in accordance with U.S. Pat. No. 5,230,833 or can be obtained as any of various commercially available products, such as the Akzo-Nobel Bindzil™ 50/80, 30/360, 159/500, 40/220, and 40/130 products and the Nalco 1050, 1060, 2327, and 2329 products, as well as other similar products available from DuPont, Bayer, Applied Research, Nissan Chemical, Fuso, and Clariant.

The colloidal silica can have any suitable average particle size (i.e., average particle diameter). The particle size of an abrasive particle is the diameter of the smallest sphere that encompasses the abrasive particle. The colloidal silica can have an average particle size of about 5 nm or more, e.g., about 10 nm or more, about 15 nm or more, about 20 nm or more, about 25 nm or more, about 30 nm or more, about 35 nm or more, or about 40 nm or more. Alternatively, or in addition, the colloidal silica can have an average particle size of about 200 nm or less, e.g., about 190 nm or less, about 180 nm or less, about 170 nm or less, about 160 nm or less, or about 150 nm or less. Thus, the colloidal silica can have an average particle size bounded by any two of the aforementioned endpoints. For example, the colloidal silica can have an average particle size of about 5 nm to about 200 nm, e.g., about 10 nm to about 200 nm, about 10 nm to about 190 nm, about 20 nm to about 180 nm, about 20 nm to about 170 nm, about 20 nm to about 160 nm, about 20 nm to about 150 nm, about 30 nm to about 150 nm, or about 40 nm to about 150 nm.

In some embodiments, the polishing composition can comprise two or more different colloidal silicas. The two or more different colloidal silicas can have the same or different average particle sizes, provided that at least one of the two or more different colloidal silicas has an average particle size as set forth herein.

In certain embodiments, the chemical-mechanical polishing composition includes an abrasive that comprises, consists essentially of, or consists of a combination of colloidal silica and fused silica. The colloidal silica can be as described herein. The abrasive can comprise any suitable relative proportion of colloidal silica to fused silica. For example, the abrasive can include about 50% to about 90% of colloidal silica and about 10% to about 50% of fused silica, relative to the total amount of the combination of colloidal silica and fused silica.

The fused silica can be any suitable fused silica. Fused silica is a distinctly different material than colloidal silica or fumed silica, and has, for example, different chemical and physical properties compared to colloidal silica and fumed silica, including different polishing characteristics. Colloidal silica typically is manufactured in solution in a wet process, as described above. The hydrolysis conditions result in distinct particle size distributions and particle morphology, as typically spherical or spheroidal particles. Fumed silica is produced by pyrolysis of a precursor such as a silicon tetrachloride, and condensation from the gas phase. Fumed silica consists of nanometer to micron-sized particles of amorphous silica having branched, chain-like, three-dimensional secondary particles which then agglomerate into tertiary particles, and has low bulk density and high surface area. In contrast, fused silica is a glass that is produced at high temperatures from, e.g., silicon, by oxidation and fusion, typically followed by comminution and/or sieving to produce a fine powder. Fused silica, like fumed silica, has a substantially fully condensed surface having little or no SiOH groups as compared to colloidal silica, which has a substantial amount of hydroxyl functionality on the particle surface.

In some embodiments, the particle morphology of fused silica can be more like the typical spherical or spheroidal particles of colloidal silica rather than the typical aggregated particles of fumed silica. In addition, fused silica has a higher true density than either colloidal silica or fumed silica. The isoelectric point of fused silica is around zero.

In certain embodiments, the particle morphology of the fused silica is highly irregular-shaped, for example, as described in co-pending U.S. patent application Ser. No. 15/951,358, the disclosure of which is incorporated herein by reference. In these embodiments, highly irregular-shaped fused silica comprises particles which may be distinguished from fused silica comprising spherical or spheroidal particles. As used herein, the terms "spherical or spheroidal particles" refer to particles that are essentially entirely rounded over their surfaces and appear (e.g., in a photomicrograph) to be relatively smooth, meaning that the particles are substantially rounded, curved, and smooth, in their cross-sectional shape in three (orthogonal) dimensions.

As opposed to spherical or spheroidal fused silica, highly irregular-shaped fused silica, as the term is used herein, comprises particles that are different from spherical or spheroidal particles, and that as a collection of particles exhibit varied forms and differing shapes and geometries, including a substantial amount of asymmetry. As opposed to entirely spherical or spheroidal surfaces and mostly symmetric cross-sections, the highly irregular-shaped particles include particles that exhibit a substantial amount of cross-sectional asymmetry, e.g., that have substantial portions of their surfaces and edges that (when viewed in a photomicrograph) are flat, bumpy, angled (angular or cornered), rough, or irregular, with flat, jagged, angled, or fractured surface features and non-rounded (e.g., linear, jagged, angular, rough, or cornered) edges of the surfaces, including particles that include a substantial or a high amount (proportionally) of non-rounded, rough, jagged, or fractured surfaces and edges.

The fused silica can have any suitable average particle size (i.e., average particle diameter). The fused silica can have an average particle size of about 10 nm or more, e.g., about 20 nm or more, about 30 nm or more, about 40 nm or more, about 50 nm or more, about 60 nm or more, about 70 nm or more, about 80 nm or more, about 90 nm or more, or about 100 nm or more. Alternatively, or in addition, the fused silica can have an average particle size of about 1000 nm or less, e.g., about 950 nm or less, about 900 nm or less, about 850 nm or less, about 800 nm or less, about 750 nm or less, about 700 nm or less, about 650 nm or less, about 600 nm or less, about 550 nm or less, or about 500 nm or less. Thus, the fused silica can have an average particle size bounded by any two of the aforementioned endpoints. For example, the fused silica can have an average particle size of about 10 nm to about 1000 nm, e.g., about 20 nm to about 900 nm, about 30 nm to about 800 nm, about 40 nm to about 700 nm, about 50 nm to about 600 nm, about 70 nm to about 600 nm, about 80 nm to about 600 nm, about 90 nm to about 600 nm, or about 100 nm to about 800 nm.

The polishing composition can comprise any suitable amount of abrasive (e.g., colloidal silica or a combination of colloidal silica and fused silica). Typically, the polishing composition can comprise about 0.1 wt. % or more of abrasive, e.g., about 0.2 wt. % or more, about 0.4 wt. % or more, about 0.6 wt. % or more, about 0.8 wt. % or more, or about 1 wt. % or more. Alternatively, or in addition, the polishing composition can comprise about 10 wt. % or less of abrasive, e.g., about 9 wt. % or less, about 8 wt. % or less, about 7 wt. % or less, about 6 wt. % or less, or about 5 wt. % or less. Thus, the polishing composition can comprise abrasive in an amount bounded by any two of the aforementioned endpoints. For example, the polishing composition can comprise about 0.1 wt. % to about 10 wt. % of abrasive, e.g., about 0.2 wt. % to about 10 wt. %, about 0.4 wt. % to about 9 wt. %, about 0.6 wt. % to about 8 wt. %, about 0.8 wt. % to about 7 wt. %, about 1 wt. % to about 10 wt. %, about 1 wt. % to about 8 wt. %, about 1 wt. % to about 6 wt. %, or about 1 wt. % to about 5 wt. %.

The abrasive preferably is colloidally stable. The term colloid refers to the suspension of abrasive particles in the liquid carrier. Colloidal stability refers to the maintenance of that suspension through time. In the context of the invention, an abrasive is considered colloidally stable if, when the abrasive is placed into a 100 ml graduated cylinder and allowed to stand unagitated for a time of 2 hours, the difference between the concentration of particles in the bottom 50 ml of the graduated cylinder (FM in terms of g/ml) and the concentration of particles in the top 50 ml of the graduated cylinder ([T] in terms of g/ml) divided by the initial concentration of particles in the abrasive composition ([C] in terms of g/ml) is less than or equal to 0.5 (i.e., {[B]−[T]}/[C]≤0.5). More preferably, the value of [B]−[T]/[C] is less than or equal to 0.3, and most preferably is less than or equal to 0.1.

The polishing composition also comprises a compound of formula (I):

wherein R is selected from
straight or branched chain $C_1$-$C_{20}$ alkyl,

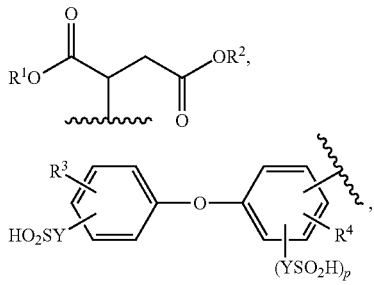

$R^5C_6H_4$,
$R^6$—O—$(R^7O)_n$—, and
$CH_2$=$CHCONHC(CH_3)_2CH_2$—,
wherein $R^1$-$R^5$ are independently selected from straight chain or branched chain $C_1$-$C_{20}$ alkyls,
wherein $R^6$ is a straight chain or branched chain $C_1$-$C_{20}$ alkyl or $R^8$—$C_6H_4$—,
wherein $R^7$ is a straight chain or branched chain $C_2$-$C_{10}$ alkylene,
wherein $R^8$ is a straight chain or branched chain $C_1$-$C_{20}$ alkyl,
wherein n is an integer of from 1 to about 20,
wherein p is 0 or 1,
wherein X and Y are independently O or a covalent bond, and
wherein A and B are independently an alkali metal cation or an organic amine compound.

Non-limiting examples of the compound of formula (I) wherein R is a straight chain or branched chain $C_1$-$C_{20}$ alkyl and wherein X is O include alkyl sulfates such as $CH_3(CH_2)_9SO_3H$, $CH_3(CH_2)_{11}SO_3H$ (dodecyl sulfate), $CH_3(CH_2)_{13}SO_3H$, $CH_3(CH_2)_{15}SO_3H$, $CH_3(CH_2)_{17}SO_3H$, and $CH_3(CH_2)_{19}SO_3H$, sodium salts thereof, and organic amine salts thereof.

Non-limiting examples of the compound of formula (I) wherein R is a branched chain $C_1$-$C_{20}$ alkyl and X is a covalent bond include secondary alkyl sulfonates, for example, wherein R is a secondary $C_{13}$-$C_{18}$ branched chain alkyl group, such as the compounds having CAS Registry Numbers 68037-49-0, 68188-18-1, and 97489-15-1.

Non-limiting examples of the compound of formula (I) wherein R is

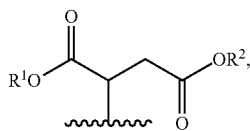

X is a covalent bond, and $R^1$ and $R^2$ are both ethyl hexyl include diethylhexyl sulfosuccinate, sodium salts thereof, and organic amine salts thereof.

Non-limiting examples of the compound of formula (I) wherein R is $R^5C_6H_4$ and X is a covalent bond include linear alkyl benzenesulfonates such as dodecyl benzenesulfonate, and other alkyl benzenesulfonates such as sec-alkyl derivatives thereof, for example, a benzenesulfonic acid $C_{10}$-$C_{13}$ sec-alkyl derivative, sodium salts thereof, and organic amine salts thereof, such as isopropylamine salts.

Non-limiting examples of the compound of formula (I) wherein R is

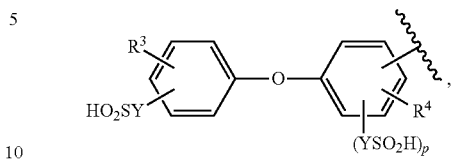

p is 1, and X and Y are both a covalent bond include diphenyloxide disulfonates, alkylated derivatives thereof (i.e., alkyl diphenyloxide disulfonates) such as diphenyloxide disulfonate $C_6$-alkyl, $C_{10}$-alkyl, and $C_{12}$-alkyl derivatives, sodium salts thereof, and organic amine salts thereof. Non-limiting examples of suitable diphenyloxide disulfonates include the Dowfax™ surfactants (Dow Chemical Co., Midland, Mich.) including Dowfax™ C10L, Dowfax™ C6L, Dowfax™ 3B2, and Dowfax™ 2A1.

Non-limiting examples of the compound of formula (I) wherein R is $R^6$—O—$(R^7O)_n$— and $R^6$ is straight or branched chain $C_1$-$C_{20}$ alkyl include mono alkyl branched propoxy sulfates such as alkyl (poly)propoxysulfates. A non-limiting example of the compound of formula (I) wherein R is $R^6$—O—$(R^7O)_n$— and $R^6$ is $R^8$—$C_6H_4$— is polyethyleneglycol nonylphenyl ether sulfate.

A non-limiting example of the compound of formula (I) wherein R is $CH_2$=$CHCONHC(CH_3)_2CH_2$— is 2-acrylamido-2-methyl-1-propanesulfonic acid.

In the compound of formula (I), A and B are independently an alkali metal cation or an organic amine. The alkali metal cation can be any suitable alkali metal cation and is not particularly limited. For example, the alkali metal cation can be lithium ion, sodium ion, potassium ion, rubidium ion, or cesium ion. The organic amine can be any suitable amine and is not particularly limited. For example, the organic amine can be a primary amine (e.g., isopropylamine), a secondary amine (e.g., diethylamine or dibutylamine), or a tertiary amine (e.g., triethylamine), and the like. When A and/or B is an organic amine, it will be understood by those of ordinary skill in the art that the compound of formula (I) is a salt of the organic amine.

The polishing composition can comprise any suitable amount of the compound of formula (I). Typically, the polishing composition comprises about 0.001 wt. % (10 ppm) or more of the compound of formula (I), e.g., about 0.002 wt. % (20 ppm) or more, about 0.003 wt % (30 ppm) or more, about 0.004 wt. % (40 ppm) or more, about 0.005 wt. % (50 ppm) or more, about 0.006 wt. % (60 ppm) or more, about 0.007 wt. % (70 ppm) or more, about 0.008 wt. % (80 ppm) or more, about 0.009 wt. % (90 ppm) or more, or about 0.01 wt. % (100 ppm) or more. Alternatively, or in addition, the polishing composition comprises about 1 wt. % (10,000 ppm) or less of the compound of formula (I), e.g., about 0.1 wt. % (1000 ppm) or less, about 0.09 wt. % (900 ppm) or less, about 0.08 wt. % (800 ppm) or less, about 0.07 wt. % (700 ppm) or less, about 0.06 wt. % (600 ppm) or less, or about 0.05 wt. % (500 ppm) or less. Thus, the polishing composition can comprise the compound of formula (I) in an amount bounded by any two of the aforementioned endpoints. For example, the polishing composition can comprise about 0.001 wt. % to about 1 wt. % (about 10 ppm to about 10,000 ppm) of the compound of formula (I), e.g., about 10 ppm to about 1000 ppm, about 20 ppm to about 900 ppm, about 30 ppm to about 800 ppm, about 40 ppm to about 700 ppm, about 50 ppm to about 600 ppm, about 60 ppm to about 500 ppm, about 70 ppm to about 500 ppm, about 80 ppm to about 500 ppm, about 90 ppm to about 500 ppm, about 100 ppm to about 500 ppm, about 150 ppm to about 500 ppm, or about 200 ppm to about 500 ppm. Preferably, the polishing composition comprises about 0.001 wt. % to about 1 wt. % of the compound of Formula (I).

The polishing composition comprises a compound of formula (II):

wherein $R^9$ is H or a hydroxyalkyl, and wherein m is an integer of from 2 to about 6.

Non-limiting examples of the compound of formula (II) include ethylenediamine and 1,3-diaminopropane.

The polishing composition can comprise any suitable amount of the compound of formula (II). Typically, the polishing composition comprises about 0.001 wt. % (10 ppm) or more of the compound of formula (II), e.g., about 20 ppm or more, about 30 ppm or more, about 40 ppm or more, about 50 ppm or more, about 60 ppm or more, about 70 ppm or more, about 80 ppm or more, about 90 ppm or more, or about 100 ppm or more. Alternatively, or in addition, the polishing composition comprises about 1 wt. % (10,000 ppm) or less of the compound of formula (II), e.g., about 2000 ppm or less, about 1800 ppm or less, about 1600 ppm or less, about 1400 ppm or less, about 1200 ppm or less, about 1000 ppm or less, about 900 ppm or less, about 800 ppm or less, about 700 ppm or less, about 600 ppm or less, or about 500 ppm or less. Thus, the polishing composition can comprise the compound of formula (II) in an amount bounded by any two of the aforementioned endpoints. For example, the polishing composition can comprise about 0.001 wt. % (10 ppm) to about 1 wt. % (10,000 ppm) of the compound of formula (II), e.g., about 10 ppm to about 2000 ppm, about 20 ppm to about 2000 ppm, about 30 ppm to about 2000 ppm, about 40 ppm to about 2000 ppm, about 50 ppm to about 2000 ppm, about 60 ppm to about 2000 ppm, about 70 ppm to about 2000 ppm, about 80 ppm to about 2000 ppm, about 90 ppm to about 2000 ppm, about 100 ppm to about 2000 ppm, about 100 ppm to about 1800 ppm, about 100 ppm to about 1600 ppm, about 100 ppm to about 1400 ppm, about 100 ppm to about 1200 ppm, or about 100 ppm to about 1000 ppm. Preferably, the polishing composition comprises about 0.001 wt. % (10 ppm) to about 1 wt. % (10,000 ppm) of the compound of formula (II), (e.g., about 500 ppm to about 1000 ppm).

In another embodiment, the polishing composition, and methods of polishing using this composition, comprises a piperazine compound, or a urea compound, in place of the compound of formula (II). In this embodiment, the piperazine compound may be any suitable piperazine compound, for example, piperazine, 1-(2-Hydroxyethyl)piperazine, 1-(2-Aminoethyl)piperazine, 1,4-Bis(2-hydroxyethyl)piperazine, 1-(3-Methylbenzyl)piperazine, 1-(4-Methoxyphenyl)piperazine dihydrochloride, or piperazine-1-carboxylic acid amide hydrochloride). Additionally, the urea compound may be any suitable urea compound, for example, urea, (2-hydroxyethyl)urea, or N,N'-Bis(hydroxymethyl)urea). The polishing composition can comprise any suitable amount of the urea compound or the piperazine compound. Preferably, the polishing composition comprises about 0.001 wt. % (10 ppm) to about 1 wt. % (10,000 ppm) (e.g., about 500 ppm to about 1000 ppm) of a piperazine compound or a urea compound.

The polishing composition comprises hydrogen peroxide. The hydrogen peroxide can be present in any suitable amount in the polishing composition. For example, the polishing composition can comprise about 0.1 wt. % to about 10 wt. % of hydrogen peroxide, e.g., about 0.5 wt. % to about 10 wt. %, about 0.5 wt. % to about 5 wt. %, about 0.1 wt. % to about 5 wt. %, about 0.1 wt. % to about 2.5 wt. %, or about 0.1 wt. % to about 1 wt. %.

The polishing composition comprises water. The water can be any suitable water and can be, for example, deionized water or distilled water. In some embodiments, the polishing composition can further comprise one or more organic solvents in combination with the water. For example, the polishing composition can further comprise a hydroxylic solvent such as methanol or ethanol, a ketonic solvent, an amide solvent, a sulfoxide solvent, and the like. Preferably, the polishing composition comprises pure water.

The polishing composition can have any suitable pH. Typically, the polishing composition can have a pH of about 1 or more, e.g., about 1.2 or more, about 1.4 or more, about 1.6 or more, about 1.8 or more, or about 2 or more. Alternatively, or in addition, the polishing composition can have a pH of about 5 or less, e.g., about 4.5 or less, about 4 or less, about 3.5 or less, or about 3 or less. Thus, the polishing composition can have a pH bounded by any two of the aforementioned endpoints. For example, the polishing composition can have a pH of about 1 to about 5, e.g., about 1 to about 4.5, about 1 to about 4, about 1 to about 3.5, about 1 to about 3, about 1 to about 2.5, or about 1 to about 2.

The polishing composition optionally comprises a mineral acid. Non-limiting examples of suitable mineral acids include nitric acid, sulfuric acid, and phosphoric acid.

The polishing composition can further comprise a base to adjust the pH of the polishing composition. Non-limiting examples of suitable bases include sodium hydroxide, potassium hydroxide, and ammonium hydroxide.

The polishing composition can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., colloidal silica or colloidal silica and fused silica, compound of formula (I), compound of formula (II), hydrogen peroxide, etc.) as well as any combination of ingredients (e.g., colloidal silica or colloidal silica and fused silica, compound of formula (I), compound of formula (II), hydrogen peroxide, etc.).

For example, the colloidal silica or colloidal silica and fused silica can be dispersed in water. The compound of formula (I) and compound of formula (II) can then be added and mixed by any method that is capable of incorporating the components into the polishing composition. The hydrogen peroxide can be added at any time during the preparation of the polishing composition. The polishing composition can be prepared prior to use, with one or more components, such as the hydrogen peroxide, added to the polishing composition just before use (e.g., within about 1 minute before use, or within about 1 hour before use, or within about 7 days before use). The polishing composition also can be prepared by mixing the components at the surface of the substrate during the polishing operation.

The polishing composition can be supplied as a one-package system comprising colloidal silica, or colloidal silica and fused silica, compound of formula (I), compound of formula (II), and water. Alternatively, the colloidal silica or colloidal silica and fused silica can be supplied as a dispersion in water in a first container, and compound of formula (I) and compound of formula (II) can be supplied in a second container, either in dry form, or as a solution or dispersion in water. The hydrogen peroxide desirably is supplied separately from the other components of the polishing composition and is combined, e.g., by the end-user, with the other components of the polishing composition shortly before use (e.g., 1 week or less prior to use, 1 day or less prior to use, 1 hour or less prior to use, 10 minutes or less prior to use, or 1 minute or less prior to use). The components in the first or second container can be in dry form while the components in the other container can be in the form of an aqueous dispersion. Moreover, it is suitable for the components in the first and second containers to have different pH values, or alternatively to have substantially similar, or even equal, pH values. Other two-container, or three or more-container, combinations of the components of the polishing composition are within the knowledge of one of ordinary skill in the art.

The polishing composition of the invention also can be provided as a concentrate which is intended to be diluted with an appropriate amount of water prior to use. In such an embodiment, the polishing composition concentrate can comprise the colloidal silica or colloidal silica and fused silica, compound of formula (I), compound of formula (II), and water, with or without the hydrogen peroxide, in amounts such that, upon dilution of the concentrate with an appropriate amount of water, and upon addition of the hydrogen peroxide if not already present in an appropriate amount, each component of the polishing composition will be present in the polishing composition in an amount within the appropriate range recited above for each component. For example, the colloidal silica or colloidal silica and fused silica, compound of formula (I), and compound of formula (II), can each be present in the concentration in an amount that is about 2 times (e.g., about 3 times, about 4 times, or about 5 times) greater than the concentration recited above for each component so that, when the concentrate is diluted with an equal volume of (e.g., 2 equal volumes of water, 3 equal volumes of water, or 4 equal volumes of water, respectively), along with the hydrogen peroxide in a suitable amount, such that each component will be present in the polishing composition in an amount within the ranges set forth above for each component. Furthermore, as will be understood by those of ordinary skill in the art, the concentrate can contain an appropriate fraction of the water present in the final polishing composition in order to ensure that other components are at least partially or fully dissolved in the concentrate.

The invention also provides a method of chemically mechanically polishing a substrate comprising (i) providing a substrate, (ii) providing a polishing pad, (iii) providing a chemical-mechanical polishing composition as described herein, (iv) contacting the substrate with the polishing pad and the chemical-mechanical polishing composition, and (v) moving the polishing pad and the chemical mechanical polishing composition relative to the substrate to abrade at least a portion of a surface of the substrate to thereby polish the substrate.

More specifically, the invention also provides a provides a method of chemically mechanically polishing a substrate comprising (i) providing a substrate, (ii) providing a polishing pad, (iii) providing a chemical-mechanical polishing composition comprising (a) an abrasive comprising colloidal silica, (b) about 10 ppm to about 1000 ppm of a compound of formula (I):

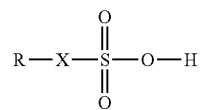

(I)

wherein R is selected from:
a straight chain or branched chain $C_1$-$C_{20}$ alkyl.

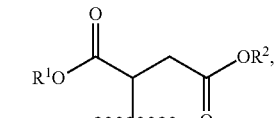

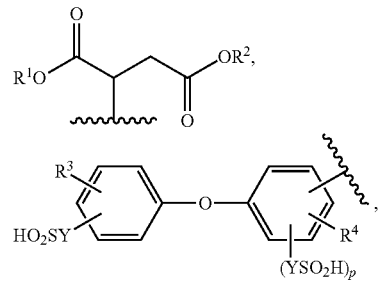

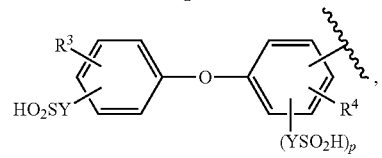

$R^5C_6H_4$,
$R^6$—O—$(R^7O)_n$—, and
$CH_2$=$CHCONHC(CH_3)_2CH_2$—,
wherein $R^1$-$R^5$ are independently selected from straight chain or branched chain $C_1$-$C_{20}$ alkyls,
wherein $R^6$ is a straight chain or branched chain $C_1$-$C_{20}$ alkyl or $R^8$—$C_6H_4$—,
wherein $R^7$ is a straight chain or branched chain $C_2$-$C_{10}$ alkylene,
wherein $R^8$ is a straight chain or branched chain $C_1$-$C_{20}$ alkyl,
wherein n is an integer of from 1 to about 20,
wherein p is 0 or 1, and
wherein X and Y are independently O or a covalent bond, or an alkali metal salt thereof,
(c) a compound of formula (II):

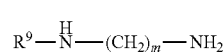

(II)

wherein $R^9$ is H or a hydroxyalkyl, and
wherein m is an integer of from 2 to about 6,
(d) hydrogen peroxide, and (e) water, wherein the polishing composition has a pH of about 1 to about 5, (iv) contacting the substrate with the polishing pad and the chemical-mechanical polishing composition, and (v) moving the polishing pad and the chemical mechanical polishing composition relative to the substrate to abrade at least a portion of a surface of the substrate to thereby polish the substrate.

The substrate to be polished using the method of the invention can be any suitable substrate, especially a substrate that contains nickel-phosphorous. A preferred substrate comprises at least one layer on a surface of the substrate, especially an exposed layer for polishing, comprising, consisting essentially of, or consisting of nickel-phosphorous, such that at least a portion of the nickel-phosphorous on a surface of the substrate is abraded (i.e., removed) to polish the substrate. Particularly suitable substrates include, but are not limited to, memory or rigid disks, such as aluminum disks coated with nickel-phosphorous. A preferred substrate is a nickel-phosphorous-coated aluminum memory disk.

The polishing method of the invention is particularly suited for use in conjunction with a chemical-mechanical polishing (CMP) apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with the polishing pad and the polishing composition of the invention and then the polishing pad moving relative to the substrate, so as to abrade at least a portion of the substrate to polish the substrate.

A substrate can be planarized or polished with the chemical-mechanical polishing composition with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

Desirably, the CMP apparatus further comprises an in situ polishing endpoint detection system, many of which are known in the art. Techniques for inspecting and monitoring the polishing process by analyzing light or other radiation reflected from a surface of the workpiece are known in the art. Such methods are described, for example, in U.S. Pat. Nos. 5,196,353, 5,433,651, 5,609,511, 5,643,046, 5,658,183, 5,730,642, 5,838,447, 5,872,633, 5,893,796, 5,949,927, and 5,964,643. Desirably, the inspection or monitoring of the progress of the polishing process with respect to a workpiece being polished enables the determination of the polishing end-point, i.e., the determination of when to terminate the polishing process with respect to a particular workpiece.

Desirably, the inventive polishing composition exhibits decreased roll-off as compared with conventional polishing compositions. In particular, the inventive polishing composition exhibits decreased XRC (extreme radius of curvature) and decreased XRCE (extreme radius of curvature at the extreme edge of the disk) as measured by an optical profilometer.

The invention can be characterized by the following embodiments.

EMBODIMENTS (1) In embodiment (1) is presented a chemical-mechanical polishing composition comprising:
(a) an abrasive comprising colloidal silica,
(b) about 0.001 wt. % to about 1 wt. % of a compound of formula (I):

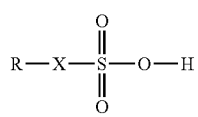
(I)

wherein R is selected from:
a straight chain or branched chain $C_1$-$C_{20}$ alkyl,

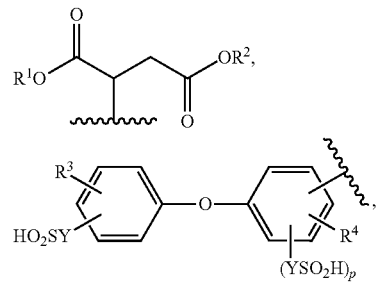

$R^5C_6H_4$,
$R^6$—O—$(R^7O)_n$—, and
$CH_2$=$CHCONHC(CH_3)_2CH_2$—,
wherein $R^1$-$R^5$ are independently selected from straight chain or branched chain $C_1$-$C_{20}$ alkyls,
wherein $R^6$ is a straight chain or branched chain $C_1$-$C_{20}$ alkyl or $R^8$—$C_6H_4$—,
wherein $R^7$ is a straight chain or branched chain $C_2$-$C_{10}$ alkylene,
wherein $R^8$ is a straight chain or branched chain $C_1$-$C_{20}$ alkyl,
wherein n is an integer of from 1 to about 20,
wherein p is 0 or 1, and
wherein X and Y are independently O or a covalent bond,
or an alkali metal salt thereof,
(c) a compound of formula (II):

(II)

wherein $R^9$ is H or a hydroxyalkyl, and
wherein m is an integer of from 2 to about 6,
(d) hydrogen peroxide, and
(e) water,
wherein the polishing composition has a pH of about 1 to about 5.

(2) In embodiment (2) is presented the polishing composition of embodiment (1), wherein the colloidal silica has an average particle size of about 10 nm to about 200 nm.

(3) In embodiment (3) is presented the polishing composition of embodiment (1) or (2), wherein the abrasive further comprises fused silica.

(4) In embodiment (4) is presented the polishing composition of embodiment (3), wherein the fused silica has an average particle size of about 100 nm to about 800 nm.

(5) In embodiment (5) is presented the polishing composition of any one of embodiments (1)-(4), wherein the compound of formula (I) is selected from sodium dodecyl sulfate, diethylhexyl sulfosuccinate, dodecylbenzene sulfonate, an alkyl diphenyloxide disulfonate, 2-acrylamido-2-methyl-1-propanesulfonic acid, and combinations thereof.

(6) In embodiment (6) is presented the polishing composition of any one of embodiments (1)-(5), wherein the compound of formula (I) is an alkyl diphenyloxide disulfonate.

(7) In embodiment (7) is presented the polishing composition of any one of embodiments (1)-(6), wherein the compound of formula (II) is selected from ethylenediamine, 1,3-diaminopropane, and combinations thereof.

(8) In embodiment (8) is presented the polishing composition of any one of embodiments (1)-(7), wherein the polishing composition comprises about 0.01 wt. % to about 0.05 wt. % of the compound of formula (I).

(9) In embodiment (9) is presented the polishing composition of any one of embodiments (1)-(8), wherein the polishing composition comprises about 0.001 wt. % to about 1 wt. % of the compound of formula (II).

(10) In embodiment (10) is presented the polishing composition of any one of embodiments (1)-(9), wherein the polishing composition comprises about 0.1 wt. % to about 10 wt. % of a combination of colloidal silica and fused silica.

(11) In embodiment (11) is presented a method of chemically mechanically polishing a substrate comprising:
(i) providing a substrate,
(ii) providing a polishing pad,
(iii) providing a chemical-mechanical polishing composition comprising:
(a) an abrasive comprising colloidal silica,
(b) about 0.001 wt. % to about 1 wt. % of a compound of formula (I):

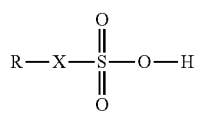

wherein R is selected from
a straight chain or branched chain $C_1$-$C_{20}$ alkyl,

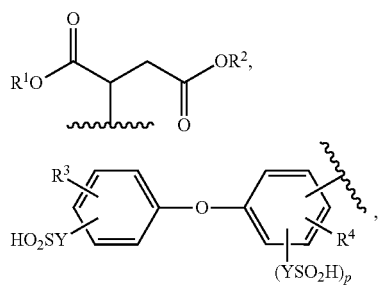

$R^5C_6H_4$,
$R^6$—O—$(R^7O)_n$—, and
$CH_2$=$CHCONHC(CH_3)_2CH_2$—,
wherein $R^1$-$R^5$ are independently selected from straight chain or branched chain $C_1$-$C_{20}$ alkyls,
wherein $R^6$ is a straight chain or branched chain $C_1$-$C_{20}$ alkyl or $R^8$—$C_6H_4$—,
wherein $R^7$ is a straight chain or branched chain $C_2$-$C_{10}$ alkylene,
wherein $R^8$ is a straight chain or branched chain $C_1$-$C_{20}$ alkyl,
wherein n is an integer of from 1 to about 20,
wherein p is 0 or 1, and
wherein X and Y are independently O or a covalent bond,
or an alkali metal salt thereof, (c) a compound of formula (II):

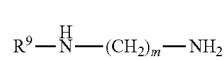

wherein $R^9$ is H or a hydroxyalkyl, and
wherein m is an integer of from 2 to about 6,
(d) hydrogen peroxide, and
(e) water,
wherein the polishing composition has a pH of about 1 to about 5,
(iv) contacting the substrate with the polishing pad and the chemical-mechanical polishing composition, and
(v) moving the polishing pad and the chemical mechanical polishing composition relative to the substrate to abrade at least a portion of a surface of the substrate to thereby polish the substrate.

(12) In embodiment (12) is presented the method of embodiment (11), wherein the colloidal silica has an average particle size of about 10 nm to about 200 nm.

(13) In embodiment (13) is presented the method of embodiment (11) or (12), wherein the abrasive further comprises fused silica.

(14) In embodiment (14) is presented the method of claim 13, wherein the fused silica has an average particle size of about 100 nm to about 800 nm.

(15) In embodiment (15) is presented the method of any one of embodiments (11)-(14), wherein the compound of formula (I) is selected from sodium dodecyl sulfate, diethylhexyl sulfosuccinate, dodecylbenzene sulfonate, an alkyl diphenyloxide disulfonate, 2-acrylamido-2-methyl-1-propanesulfonic acid, and combinations thereof.

(16) In embodiment (16) is presented the method of any one of embodiments (11)-(15), wherein the compound of formula (I) is an alkyl diphenyloxide disulfonate.

(17) In embodiment (17) is presented the method of any one of embodiments (11)-(16), wherein the compound of formula (II) is selected from ethylenediamine, 1,3-diaminopropane, and combinations thereof.

(18) In embodiment (18) is presented the method of any one of embodiments (11)-(17), wherein the polishing composition comprises about 100 ppm to about 5000 ppm of the compound of formula (I).

(19) In embodiment (19) is presented the method of any one of embodiments (11)-(18), wherein the polishing composition comprises about 100 ppm to about 2000 ppm of the compound of formula (II).

(20) In embodiment (20) is presented the method of any one of embodiments (11)-(19), wherein the polishing composition comprises about 0.1 wt. % to about 10 wt. % of a combination of colloidal silica and fused silica.

(21) In embodiment (21) is presented the method of any one of embodiments (11)-(20), wherein the substrate is a nickel-phosphorous-coated aluminum memory disk, wherein the substrate comprises nickel-phosphorous on a surface of the substrate, and wherein at least a portion of the nickel-phosphorous on a surface of the substrate is abraded to polish the substrate.

(22) In embodiment (22) is presented a chemical-mechanical polishing composition comprising:
(a) an abrasive comprising colloidal silica,
(b) about 0.001 wt. % to about 1 wt. % of a compound of formula (I):

wherein R is selected from:
a straight chain or branched chain $C_1$-$C_{20}$ alkyl,

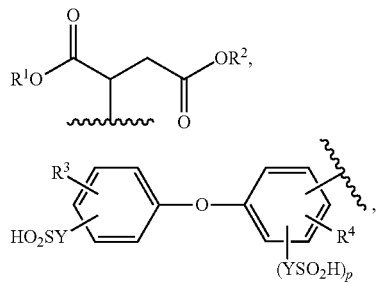

$R^5C_6H_4$,
$R^6$—O—$(R^7O)_n$—, and
$CH_2$=CHCONHC$(CH_3)_2CH_2$—,
wherein $R^1$-$R^5$ are independently selected from straight chain or branched chain $C_1$-$C_{20}$ alkyls,
wherein $R^6$ is a straight chain or branched chain $C_1$-$C_{20}$ alkyl or $R^8$—$C_6H_4$—,
wherein $R^7$ is a straight chain or branched chain $C_2$-$C_{10}$ alkylene,
wherein $R^8$ is a straight chain or branched chain $C_1$-$C_{20}$ alkyl,
wherein n is an integer of from 1 to about 20,
wherein p is 0 or 1, and
wherein X and Y are independently O or a covalent bond,
or an alkali metal salt thereof,
(c) a urea compound or a piperazine compound,
(d) hydrogen peroxide, and
(e) water,
wherein the polishing composition has a pH of about 1 to about 5.

(23) In embodiment 23, is presented the polishing composition of embodiment (22), wherein the piperazine compound is selected from piperazine, 1-(2-Hydroxyethyl)piperazine, 1-(2-Aminoethyl)piperazine, 1,4-Bis(2-hydroxyethyl)piperazine, 1-(3-Methylbenzyl)piperazine, 1-(4-Methoxyphenyl)piperazine dihydrochloride, and piperazine-1-carboxylic acid amide hydrochloride), and the urea compound is selected from urea, (2-hydroxyethyl)urea, and N,N'-Bis(hydroxymethyl)urea). The composition of claim 22, wherein the colloidal silica has an average particle size of about 10 nm to about 200 nm.

(24) In embodiment (24), is presented the polishing composition of any one of embodiments (22) and (23), wherein at least one of the following is included, (a) the abrasive further comprises fused silica, (b) the fused silica has an average particle size of about 100 nm to about 800 nm, (c) the colloidal silica has an average particle size of about 10 nm to about 200 nm.

(25) In embodiment (25), is presented a method of chemically mechanically polishing a substrate comprising:
(i) providing a substrate,
(ii) providing a polishing pad,
(iii) providing a chemical-mechanical polishing composition comprising any of the compositions of embodiments (22)-(24).

The following examples further illustrate the invention but, of course, should not be construed as in any way limiting its scope.

In the examples that follow, nickel-phosphorus-coated aluminum disks were polished with a Filwel CR200™ polishing pad using a Speedfam™ 16B polisher (Konegawa, Japan). Thirty (30) disks were polished in each run at a slurry flow rate of 550 mL/min. After polishing, the disks were cleaned in an ultrasonic bath using a cleaning solution, and then dried. Edge roll-off measurements XRC (extreme radius of curvature), XRCE (extreme radius of curvature at the extreme edge of the disk), and microwaviness were determined using a Zygo Newview™ 7300 (Middlefield, Conn.) at 80-500 µm wavelength. Two disks from each run were measured at 120°, 240°, and 360° of the disk (double-sided), respectively. Lower XRC/XRCE values indicate lesser edge roll-off.

Example 1

This example demonstrates the effect of a combination of a compound of formula (I) and a compound of formula (II) on the XRC, XRCE, microwaviness, and Ni—P removal rates exhibited by polishing compositions further containing colloidal silica.

Nickel-phosphorus-coated aluminum disks were polished with Polishing Compositions 1A-1N. Each of Polishing Compositions 1A-1N contained 9 wt. % of colloidal silica and 1 wt. % hydrogen peroxide in water at a pH of 1.6. Polishing Compositions 1A-1N further contained varying amounts of ethylenediamine (i.e., a compound of formula (II)) and Dowfax™ C10L (i.e., a compound of formula (I)) as set forth in Table 1.

TABLE 1

Components of Polishing Compositions 1A-1N

| Polishing Composition | Compound of Formula (I) (Dowfax ™ C10L) (ppm) | Compound of Formula (II) (Ethylenediamine) (ppm) |
|---|---|---|
| 1A (control) | 0 | 0 |
| 1B (comparative) | 0 | 300 |
| 1C (comparative) | 0 | 600 |
| 1D (comparative) | 0 | 1200 |
| 1E (comparative) | 0 | 1800 |
| 1F (comparative) | 200 | 0 |
| 1G (inventive) | 200 | 300 |
| 1H (inventive) | 200 | 600 |
| 1I (inventive) | 200 | 1200 |
| 1J (inventive) | 200 | 1800 |
| 1K (comparative) | 300 | 0 |
| 1L (inventive) | 300 | 600 |
| 1M (inventive) | 300 | 1200 |
| 1N (inventive) | 300 | 1800 |

Following polishing, the XRC, XRCE, microwaviness, and Ni—P removal rates were determined, and the results depicted graphically in FIGS. 1A (XRC), 1B (XRCE), 1C (microwaviness), and 1D (Ni—P removal rates).

As is apparent from the results shown in FIG. 1A, increasing the concentration of a compound of Formula (II), i.e., ethylenediamine, in Polishing Compositions 1A-1E, which did not contain a compound of Formula (I), i.e., Dowfax™ C10L, from 0 ppm (Polishing Composition 1A) to 600 ppm (Polishing Composition 1C) resulted in a slight improvement in XRC, while further increasing the concentration of ethylenediamine to 1200 ppm (Polishing Composition 1D) and 1800 ppm (Polishing Composition 1E) resulted in a decrease (worsening) of XRC. The presence of 200 ppm or 300 ppm of Dowfax™ C10L (Polishing Compositions 1E-1J and 1K-1N) resulted in improvement in XRC with increasing concentration of ethylenediamine.

As is apparent from the results shown in FIG. 1B, increasing ethylenediamine concentrations in Polishing Compositions 1A-1E, which did not further contain Dowfax™ C10L, did not result in a significant change in XRCE. Increasing ethylenediamine concentrations in Polishing Compositions 1E-1J and 1K-1N, which further contained 200 ppm or 300 ppm of Dowfax™ C10L, respectively, resulted in a decrease (improvement) in XRCE that appeared maximal at 1200 ppm of ethylenediamine.

As is apparent from the results shown in FIG. 1C, Polishing Compositions 1E-1J and 1K-1N, which contained 200 ppm or 300 ppm of Dowfax™ C10 in Polishing Compositions 1E-1J and 1K-1N, exhibited satisfactory Ni—P removal rates at all ethylenediamine concentrations as compared to Polishing Compositions 1A-1E, which did not further contain Dowfax™ C10.

As is apparent from the results shown in FIG. 1D, increasing ethylenediamine concentrations in all of Polishing Compositions 1A-1E, 1F-1J and 1K-1N resulted in improvement in microwaviness. Polishing Compositions 1E-1J and 1K-1N, which further contained 200 ppm or 300 ppm of Dowfax™ C10L, respectively, exhibited a small but significant decrease in microwaviness at dosages of ethylenediamine of 600 ppm or higher, relative to control Polishing Composition 1A.

Thus, the results illustrated by FIGS. 1A-1D collectively illustrate that the combination of a compound of formula (I) and a compound of formula (II) in a polishing composition also comprising colloidal silica provides satisfactory removal rates for Ni—P substrates while substantially improving edge performance (i.e., XRC and XRCE) and microwaviness.

Example 2

This example demonstrates the effect of different sulfonate surfactants (i.e., compounds of formula (I)) in combination with a compound of formula (II) on the XRC XRCE, microwaviness, and Ni—P removal rates exhibited by polishing compositions further containing colloidal silica.

Nickel-phosphorus-coated aluminum disks were polished with Polishing Compositions 2A-2I. Each of Polishing Compositions 2A-2I contained 9 wt. % of colloidal silica, 600 ppm of a compound of formula (II) (i.e., ethylenediamine), and 1 wt. % hydrogen peroxide in water at a pH of 1.6. Polishing Composition 2A did not further contain a compound of formula (I). Polishing Compositions 2B-2I further contained 200 ppm of a compound of formula (I) (i.e., sulfonate surfactant) as set forth in Table 2.

TABLE 2

Components of Polishing Compositions 2A-2I

| Polishing Composition | Compound of Formula (I) (Sulfonate Surfactant) | Type of Sulfonate Surfactant | Number of Carbon Atoms in Sulfonate Surfactant |
|---|---|---|---|
| 2A (comparative) | None | | N/A |
| 2B (inventive) | Dowfax ™ C6L | Disulfonate | 6 |
| 2C (inventive) | 2-acrylamido-2-methyl-1-propanesulfonic acid | Monosulfonate | 7 |
| 2D (inventive) | Dowfax ™ 3B2 | Disulfonate | 10 |
| 2E (inventive) | Dowfax ™ C10L | Disulfonate | 10 |
| 2F (inventive) | Dowfax ™ 2A1 | Disulfonate | 12 |
| 2G (inventive) | Sodium dodecyl sulfonate | Monosulfonate | 12 |
| 2H (inventive) | Sodium dodecylbenzene sulfonate | Monosulfonate | 18 |
| 2I (inventive) | Diethylhexyl sulfosuccinate | Monosulfonate | 20 |

Following polishing, the XRC, XRCE, microwaviness, and Ni—P removal rates were determined, and the results depicted graphically in FIGS. 2A (XRC), 2B (XRCE), 2C (microwaviness), and 2D (Ni—P removal rates). The graphs depicted in FIGS. 2A-2D have XRC (FIG. 2A), XRCE (FIG. 2B), microwaviness (μWa-s) (FIG. 2C), or Ni—P removal rate on the Y-axis and the number of carbon atoms of the sulfonate surfactant on the X-axis.

As is apparent from the from the results shown in FIG. 2A, Polishing Composition 2E, which contained the 10-carbon diphenyloxide disulfonate surfactant Dowfax™ C10L, and Polishing Composition 2F, which contained the 12-carbon diphenyloxide disulfonate surfactant Dowfax™ 2A1, exhibited the least negative (best) XRC in polishing Ni—P-coated aluminum disks.

As is apparent from the results shown in FIG. 2B, Polishing Composition 2E, which contained the 10-carbon diphenyloxide disulfonate surfactant Dowfax™ C10L, exhibited the lowest (best) XRCE in polishing Ni—P-coated aluminum disks.

As is apparent from the results shown in FIG. 2C, Polishing Compositions 2B, 2C, and 2E, which contained the 6-carbon diphenyloxide disulfonate surfactant Dowfax™ C6L, 2-acrylamido-2-methyl-1-propanesulfonic acid, and the 10-carbon diphenyloxide disulfonate surfactant Dowfax™ C10L, respectively, exhibited microwaviness comparable to Polishing Composition 1A, which did not contain a sulfonate surfactant.

As is apparent from the results shown in FIG. 2D, Polishing Compositions 2B-2I, which contained sulfonate surfactants, exhibited satisfactory Ni—P removal rates as compared with Polishing Composition 2A, which did not contain a sulfonate surfactant.

As is apparent from the results shown in FIGS. 2A-2D, polishing compositions comprising sulfonate surfactants with 6-12 carbon atoms in combination with ethylenediamine exhibited substantially improved edge performance, i.e., XRC and XRCE, while also providing satisfactory microwaviness and Ni—P removal rates, as compared to polishing compositions comprising sulfonate surfactants with a number of carbon atoms outside of the range.

Example 3

This example demonstrates the effect of a sulfonate surfactant of formula (I) in combination with different compounds of formula (II) or urea compounds, or piperazine compounds, on the XRC XRCE, microwaviness, and Ni—P removal rates exhibited by polishing compositions further containing colloidal silica.

Nickel-phosphorus-coated aluminum disks were polished with Polishing Compositions 3A-3D. Composition 3A contained 9 wt. % colloidal silica, 600 ppm of a compound of formula (II) (i.e., ethylenediamine), and 1 wt. % hydrogen peroxide in water at a pH of 1.6. Each of Polishing Compositions 3B-3D contained 9 wt. % of colloidal silica, 600 ppm of a compound of formula (II) as described in the Table, 200 ppm of a compound of formula (I) (i.e., Dowfax C10L) and 1 wt. % hydrogen peroxide in water at a pH of 1.6.

Following polishing, the XRC, XRCE, microwaviness, and Ni—P removal rates were determined, and the results depicted in Table 3. As is apparent from the from the results in Table 3, urea compounds and piperazine compounds have a similar effect as compounds of formula (II) on XRC, XRCE, microwaviness, and Ni—P removal rates when used in combination with a compound of formula (I).

TABLE 3

| # | Formula I (200 ppm) | Formula II (600 ppm) | XRC (nm) | XRCE (nm) | RR (mg/min) | uWa-s (Angstrom) |
|---|---|---|---|---|---|---|
| 3A | None | Ethylene-diamine | −16 | 156 | 34.0 | 2.09 |
| 3B | Dowfax C10L | Ethylene-diamine | −11 | 126 | 27.0 | 2.02 |
| 3C | Dowfax C10L | Urea | −13 | 142 | 27.3 | 2.08 |
| 3D | Dowfax C10L | 1-(2-Hydroxy-ethyl)piperazine | −12 | 136 | 26.9 | 2.10 |

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical-mechanical polishing composition comprising:
   (a) an abrasive comprising colloidal silica,
   (b) about 0.001 wt. % to about 1 wt. % of a compound of formula (I):

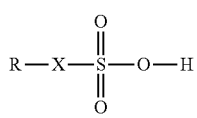

wherein R is CH$_2$=CHCONHC(CH$_3$)$_2$CH$_2$—,
   wherein X is independently O or a covalent bond, or an alkali metal salt thereof,
   (c) a compound of formula (II):

wherein R$^9$ is H or a hydroxyalkyl, and
   wherein m is an integer of from 2 to about 6,
   (d) hydrogen peroxide, and
   (e) water,
   wherein the polishing composition has a pH of about 1 to about 5.

2. The polishing composition of claim 1, wherein the colloidal silica has an average particle size of about 10 nm to about 200 nm.

3. The polishing composition of claim 1, wherein the abrasive further comprises fused silica.

4. The polishing composition of claim 3, wherein the fused silica has an average particle size of about 100 nm to about 800 nm.

5. The polishing composition of claim 1, wherein the compound of formula (I) is 2 acrylamido-2-methyl-1-propanesulfonic acid.

6. The polishing composition of claim 1, wherein the compound of formula (II) is selected from ethylenediamine, 1,3-diaminopropane, and combinations thereof.

7. The polishing composition of claim 1, wherein the polishing composition comprises about 0.001 wt. % to about 1 wt. % of the compound of formula (II).

8. The polishing composition of claim 1, wherein the polishing composition comprises about 0.1 wt. % to about 10 wt. % of a combination of colloidal silica and fused silica.

9. A method of chemically mechanically polishing a substrate comprising:
   (i) providing a substrate,
   (ii) providing a polishing pad,
   (iii) providing a chemical-mechanical polishing composition comprising:
(a) an abrasive comprising colloidal silica,
(b) about 0.001 wt. % to about 1 wt. % of a compound of formula (I):

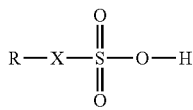

wherein R is
$CH_2=CHCONHC(CH_3)_2CH_2—$,
   wherein X is independently O or a covalent bond, or an alkali metal salt thereof,
(c) a compound of formula (II):

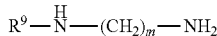

wherein $R^9$ is H or a hydroxyalkyl, and
wherein m is an integer of from 2 to about 6,
(d) hydrogen peroxide, and
(e) water,
wherein the polishing composition has a pH of about 1 to about 5,
   (iv) contacting the substrate with the polishing pad and the chemical-mechanical polishing composition, and
   (v) moving the polishing pad and the chemical mechanical polishing composition relative to the substrate to abrade at least a portion of a surface of the substrate to thereby polish the substrate.

10. The method of claim 9, wherein the colloidal silica has an average particle size of about 10 nm to about 200 nm.

11. The method of claim 9, wherein the abrasive further comprises fused silica.

12. The method of claim 11, wherein the fused silica has an average particle size of about 100 nm to about 800 nm.

13. The method of claim 9, wherein the compound of formula (1) is 2 acrylamido-2-methyl-1-propanesulfonic acid.

14. The method of claim 9, wherein the compound of formula (II) is selected from ethylenediamine, 1,3-diaminopropane, and combinations thereof.

15. The method of claim 9, wherein the polishing composition comprises about 100 ppm to about 500 ppm of the compound of formula (I).

16. The method of claim 9, wherein the polishing composition comprises about 100 ppm to about 2000 ppm of the compound of formula (II).

17. The method of claim 9, wherein the polishing composition comprises about 0.1 wt. % to about 10 wt % of a combination of colloidal silica and fused silica.

18. The method of claim 9, wherein the substrate is a nickel-phosphorous-coated aluminum memory disk, wherein the substrate comprises nickel-phosphorous on a surface of the substrate, and wherein at least a portion of the nickel-phosphorous on a surface of the substrate is abraded to polish the substrate.

* * * * *